United States Patent [19]

Aakalu et al.

[11] 4,265,775

[45] May 5, 1981

[54] NON-BLEEDING THIXOTROPIC THERMALLY CONDUCTIVE MATERIAL

[75] Inventors: Nandakumar G. Aakalu, Poughkeepsie; Lawrence A. Rittmiller, Saugerties, both of N.Y.

[73] Assignee: International Business Machines Corporation, Armonk, N.Y.

[21] Appl. No.: 67,481

[22] Filed: Aug. 16, 1979

[51] Int. Cl.³ .................... H01B 3/46; H01B 3/20; H01B 3/10
[52] U.S. Cl. .................... 252/573; 252/28; 252/75
[58] Field of Search .............. 252/63.2, 63.5, 78.3, 252/75, 28; 174/110 S

[56] References Cited

U.S. PATENT DOCUMENTS

| | | | |
|---|---|---|---|
| 2,428,608 | 10/1947 | Bass | 174/110 S |
| 3,405,066 | 10/1968 | McGhee et al. | 252/63.5 |
| 3,882,033 | 5/1975 | Wright | 252/63.5 |

Primary Examiner—Harris A. Pitlick
Attorney, Agent, or Firm—Sughrue, Rothwell, Mion, Zinn and Macpeak

[57] ABSTRACT

A non-bleeding thixotropic thermally conductive material finding particular use for enhancing the cooling ability of electrical components which comprises a silicone liquid carrier, a thermal filler powder of lamellar or dendritic shape and silica fibers.

10 Claims, 6 Drawing Figures

THERMAL CONDUCTIVITIES VERSUS FILLER VOLUMETRIC LOADING

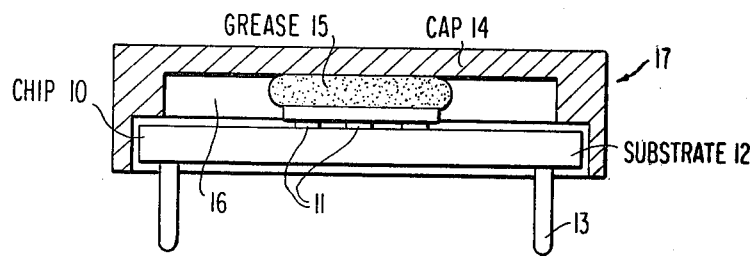
FIG.1
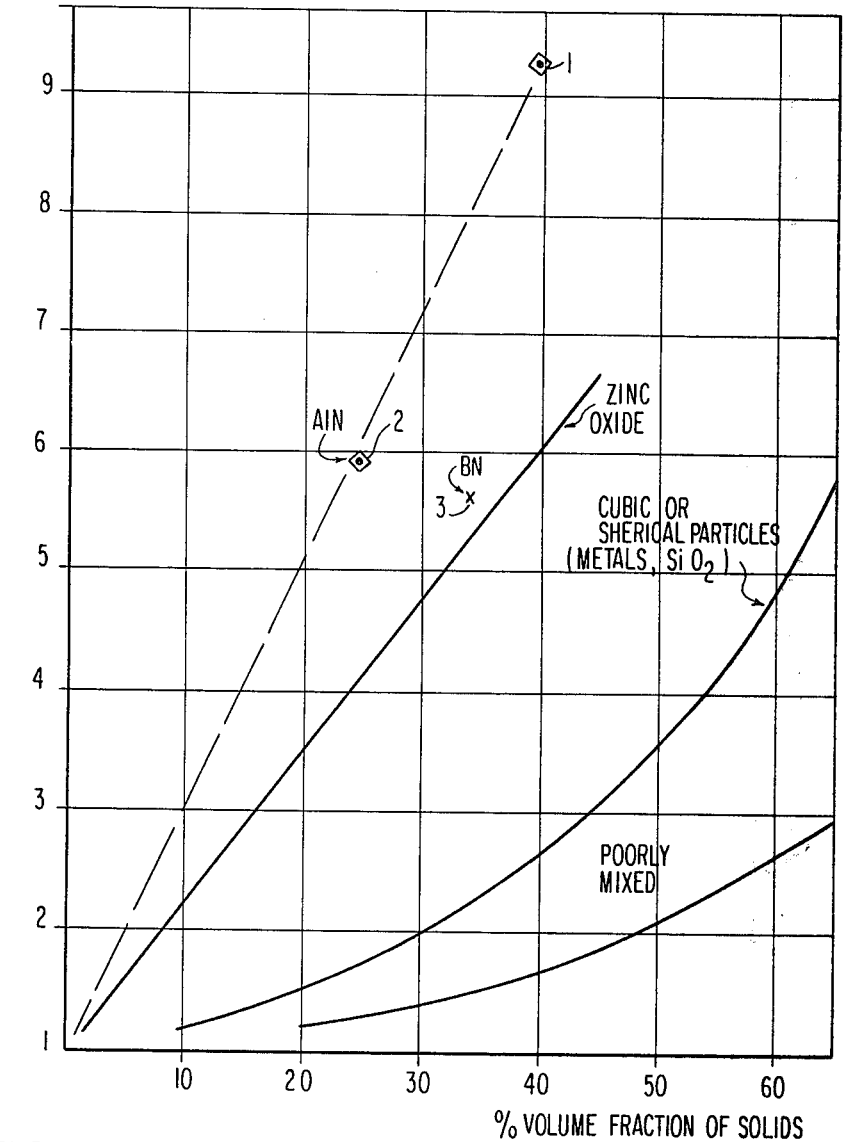
FIG.2 THERMAL CONDUCTIVITIES VERSUS FILLER VOLUMETRIC LOADING

NON-BLEEDING THIXOTROPIC THERMALLY CONDUCTIVE MATERIAL

BACKGROUND OF THE INVENTION

1. Field of the Invention

The present invention relates to non-bleeding thixotropic thermally conductive materials which find special use as heat transfer materials for cooling electronic components.

2. Description of the Prior Art

U.S. Pat. No. 4,001,128 to Penneck teaches an electrical insulating material especially suitable for high-voltage applications which comprises a polymer and an anti-tracking filler system comprising at least 20% by weight of aluminum trihydrate and at least 1% by weight of an inorganic silica filler which has been treated with an organic silicone compound. While liquid silicone materials are mentioned as possible polymers, this patent fails to disclose any improvement in bleed characteristics and does not disclose the use of thermal filler powders or bleed stopping agents as contemplated in the present invention. It should be noted that aluminum trihydrate is alien to the present invention; its main function in Penneck appears to be as a water retainer.

U.S. Pat. No. 2,428,608 to Bass teaches plastic dielectric compositions which comprise a finely-divided inorganic aerogel, e.g., of silicon dioxide, aluminum oxide or iron oxide, or a mixture thereof, blended with a liquid polymer of an organo-silicone to be well adapted for sealing the space between an electric conductor and an adjacent grounded metal. This patent does not suggest the unique characteristics of the material of the present invention nor the use of a thermal filler powder having the specified characteristics called for in the present invention. It should be noted that Bass specifically suggests the use of powdered mica; mica is a good heat insulator and, since it is a mineral, its purity cannot be readily controlled. It thus cannot be substituted for either the boron or aluminum nitride of the present invention.

U.S. Pat. No. 3,882,033 to Wright teaches that organo-polysiloxane grease compositons of low noise level having, inter alia, good dielectric properties and heat transfer properties, can be obtained by utilizing certain proportioons of a polysiloxane fluid, a dielectric desiccant selected from anhydrous calcium sulfate and synthetic zeolites, and a grease thickening and thermal conducting agent. Useful thickening agents include silica, and useful thermal conducting agents include zinc oxide. This reference does not suggest the unique characteristics of the material of the present invention, nor is any specific emphasis placed upon the size of the thermal filler powder. Materials such as anhydrous calcium sulphate and synthetic zeolite are alien to the present invention; their presence would be harmful to the thermally conductive material claimed herein.

U.S. Pat. No. 2,890,170 to Ragborg teaches organosiloxane greases having improved corrosion resistance which contain a grease thickening agent and certain proportions of benzotriazole. Useful grease thickening agents include silicon dioxide and zinc oxide.

U.S. Pat. No. 3,131,148 to Taulli teaches thickening organic liquids by the addition of amorphous metal-containing silica aerogels. The compositions are stated to be thixotropic.

U.S. Pat. No. 3,364,144 to Pulvari teaches ferroelectic, ferrielectric and pizeoeletric dielectric compositions which comprise crystalline flakes or small platelets of mixed bismuth oxides bonded with a high dielectric constant inorganic binder, for example, bismuth borate glass. Measurements by the present inventors have established that, dielectric strength is not overly influenced by particles size.

U.S. Pat. No. 3,725,275 to Carter et al. teaches that grease compositions can be thickened with aluminum carboxylate salts and, for example, silica.

U.S. Pat. No. 3,947,373 to Sobajima et al. discloses a novel electrically insulating powdery material which consists of a calcined product of a mixture of magnesium oxide and boron oxide.

SUMMARY OF THE INVENTION

The present invention provides novel non-bleeding thixotropic thermally conductive dielectric materials which find particular application in the cooling of electronic components, especially in direct contact with integrated circuit chips.

The composition of the present invention comprises a liquid silicone carrier, a thermal filler powder selected from the group consisting of lamellar aluminum nitride, dendritic zinc oxide, lamellar boron nitride or mixtures thereof in combination with silica fibers which function as a bleed inhibiting agent.

One object of the present invention is to provide non-bleeding thixotropic thermally conductive dielectric materials.

A further object of the present invention is to provide such materials which show an extremely high thermal conductivity gain per unit of filler.

BRIEF DESCRIPTION OF THE DRAWINGS

FIG. 1 is a schematic cross-sectional view of an electron component wherein the thermally conductive grease of the present invention is utilized.

FIG. 2 is a plot of thermal conductivity values versus thermal filler powder volumetric loading for various embodiments within and outside the present invention.

DESCRIPTION OF THE PREFERRED EMBODIMENTS

Figure 3:
FIG. 3 is a scanning electron microscope photograph of dendritic zinc oxide powder as used in the present invention.

During use, many electrical components generate heat, and for proper functioning of the electric component, it is necessary to remove the heat from the component.

Although a number of means of accomplishing this heat transfer have been proposed in the art, for small electronic modules, especially those which contain integrated circuit chips, a thermally conductive grease has been utilized. Such modules generally comprise a cap portion to protect the integrated circuit chip; the thermally conductive grease is typically applied between the integrated circuit chip and the cap, either in direct contact with both elements or separated from one or both by a thin wall of some type. Heat generated from the integrated circuit chip during use is conducted from the integrated circuit chip by the grease to the module cap, whereafter it is dissipated into the ambient surroundings.

Thermally conductive greases for this purpose are well known; typically, they comprise a liquid carrier of some type and a thermal filler to increase heat conduction. Various other components may also be present to achieve various specific purposes, for example, to thicken the grease, remove moisture from the grease, and the like.

The present invention provides such a thermally conductive grease which exhibits the following excellent features:

Firstly, it is not subject to the fault of bleeding to any significant extent, i.e., no substantial degree of liquid separation occurs during use.

Secondly, it is thixotropic, i.e., it can be easily applied, but once pressure is removed, it maintains a jelly-like form in contact with the electrical component.

It exhibits very high thermal conductivity gains with the use of low amounts of filler.

It does not cause any corrosion problems when in contact with electrical components.

It has excellent dielectric properties, i.e., high dielectric strength.

It has excellent long term thermal stability.

The individual components of the thermally conducting grease of the present invention, i.e., liquid silicone carrier, thermal filler powder, and bleed inhibiting agent, and their proportions in the thermally conductive grease of the present invention are discussed below.

Liquid Carrier

The liquid carrier in accordance with the present invention is a liquid silicone material. In theory, any liquid silicone materials can be used in the present invention with proper variation of the proportions of the three components of the thermally conductive grease of the present invention so long as it is resistant to drying out over extended periods of time, retains the thermal filler powder and submicron silica fibers without separation, is chemically inert, and has high thermal conductivity. It is preferred, however, that the liquid organo-silicone compound have a viscosity of from about 10 centistokes to about 10,000 centistokes at 25° C., and most preferred that the liquid organo-silicone compound have a viscosity of from 20 to 1000 centistokes at 25° C.

Most preferred liquid organo-silicone compounds for use in the present invention are the liquid organo-polysiloxanes which can be represented by the following formula:

where R represents an alkyl radical having up to 22 carbon atoms, a cycloalkyl radical having 5-7 carbon atoms in the ring, mononuclear and binuclear aryl radicals, mononuclear aryl lower alkyl radicals, cyano lower alkyl radicals, and lower alkenyl radicals having from 2 to 8 carbon atoms; and n has a value of from 2.002 to 3.0. The organo-polysiloxanes as described in U.S. Pat. No. 3,882,033 to Wright, hereby incorporated by reference, are, in general, useful in the present invention.

Most preferred for use in the present invention is polydimethylsiloxane having a viscosity of about 100 centistokes at 25° C.

If desired, a conventional wetting agent can be used in the composition of the present invention to increase the amount of thermal filler powder. The wetting agent can be selected from those conventionally known in the art, and we have not found any special criticality to be attached to the exact identity thereof. For example, conventional anionic, cationic or nonionic wetting agents can be used, typical examples of which include Tergitol NR 27 (nonionic), Tergitol No. 7 (anionic) and Triton X-100 (cationic) wetting agents. When used, we generally prefer to use the minimum amount of wetting agent which permits an increase in the amount of thermal filler powder. Usually, this will be less than about 5 volume percent. The use of such a wetting agent (or surface active agent) also facilitates mixing of the composition of the present invention.

The Bleed Inhibiting Agent

The bleed inhibiting agent of the present invention comprises silica fibers, the majority of which are less than 1 micron in size, and substantially all of which are less than 5 microns in size.

Figure 6:
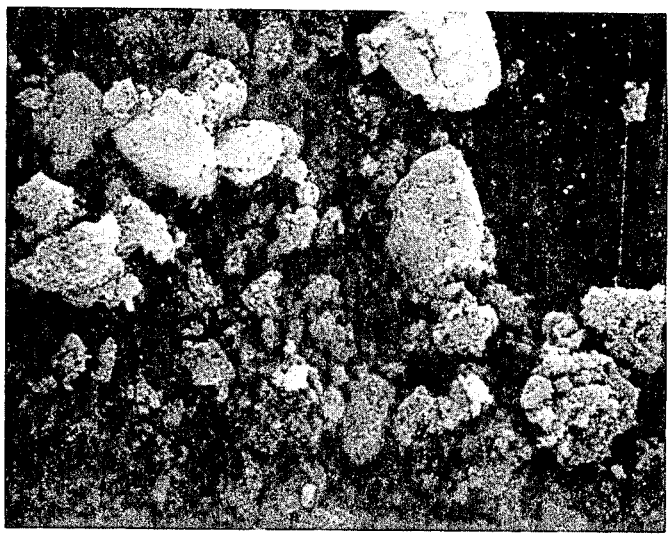
FIG. 6 is a scanning electron electron microscope photograph of silica fibers as used in the present invention.

Further, the silica fibers of the present invention are generally so small that when size measurements are given the size represents the average silica fiber diameter, i.e., the fibers tend to be rather spherical in shape as shown in FIG. 6, and thus average diameter can be used to particularize the dimensions thereof as opposed to, for example, a diameter plus length measurement as would typically be used for a fiber in the textile art.

We discovered that if such silica fibers were added to the liquid organo-silicone carrier prior to adding the thermal filler powder, separation of the thermal filler powder from the organo-silicone liquid was substantially eliminated.

While we do not wish to be bound, we believe that the silica fibers form some type of framework or network in which the thermal filler powder is retained; we found this to be quite surprising since the amounts of silica fibers (substantially none bigger than 5 microns in size, most smaller than 1 micron) utilized are very small as compared to the overall materials in the thermally conductive grease of the present invention.

The bleed inhibiting agent above discussed is quite different from a silica aerogel. The silica fibers of the present invention are highly porous, and it is most preferred that at least about 80 volume percent thereof be smaller than 1 micron. The minimum size of the silica fibers is not important, and we have yet to discover any minimum silica fiber size which will not be effective in the present invention. The maximum silica fiber size, tends to be important, however, as discussed above.

FIG. 6 shows typical silica fibers as used in the present invention.

In addition, the consistency of thermally conductive greases formed in accordance with the present invention utilizing the silica fibers changes only slightly over a wide temperature range, e.g., −40° C. to 200° C.

Whatever theory is involved, we have found that by using the silica fibers in accordance with the present invention, little or no bleeding (loss of liquid organo silicone carrier) from the thermally conductive grease of the present invention occurs, even with use for extended times. We also found that in the absence of the bleed-inhibiting agent, even using intensive mixing bleeding would occur after a period of time.

The Thermal Filler Powder

Perhaps the most important aspect of the present invention is the utilization of certain highly specific thermal filler powders. We have discovered that it is necessary to use such thermal filler powders, in combination with the silica fibers, in order to achieve the non-bleed characteristics of the present invention in combination with very high thermal conductivity gain per unit of filler.

For reasons of which we are not sure, we have discovered that the shape of the thermal filler powder is extremely important to achieve the results of the present invention. In fact, we have discovered that size and shape are more important than solid conductivity values of the thermal filler powder used. Specifically, for thermal filler powders of the same shape and size, the thermally conductive greases of the present invention illustrate very similar thermal conductivity values, regardless of the solid conductivity value of the thermal filler powder per se.

Specifically, spherical- and cubical-shaped thermal filler powders are unacceptable in the present invention; thus, the use of $SiO_2$ or $Al_2O_3$ as a thermal filler material does not provide the results of the present invention.

We discovered that a certain dendritic material, i.e., zinc oxide, provides results substantially superior to cubic or spherical materials, such as $SiO_2$ or $Al_2O_3$.

In addition, we have discovered that certain lamellar materials, i.e., AlN and BN, offer superior results in the thermally conductive grease of the present invention, and are thus most preferred for use in the present invention.

In accordance with the present invention, the thermal filler powder utilized is selected from the group consisting of dendritic zinc oxide, lamellar aluminum nitride, lamellar boron nitride or a mixture thereof.

In this regard, while zinc oxide is available in four different particle shapes, only dendritic zinc oxide is useful in the present invention. Accordingly, of the zinc oxide present, at least about 80 volume percent of the zinc oxide must be dendritic zinc oxide, preferably all the zinc oxide used being dendritic zinc oxide.

Dendritic zinc oxide, of course, has the tree-like or arborescent structure typical of dendritic materials in general.

In a similar fashion, the boron nitide or aluminum nitride used in the present invention should be at least about 50 volume percent lamellar and preferably all the boron and/or aluminum nitride present is lamellar.

In those situations where a mixture of two or more of dendritic zinc oxide, lamellar boron nitride or lamellar aluminum nitride is used, the above percentages also apply. Specifically, at least about 80 volume percent of the zinc oxide present should be dendritic and at least about 50 volume percent of the aluminum and/or boron nitride should be lamellar. Where a mixture of two or more of dendritic zinc oxide, lamellar boron nitride or lamellar aluminum nitride is used, there is no special restriction on the individual ratios of dendritic zinc oxide, lamellar boron nitride or lamellar nitride. For example, high proportions of dendritic oxide could be used with very low proportions of lamellar boron nitride and/or lamellar aluminum nitride, or vice versus.

Figure 4:
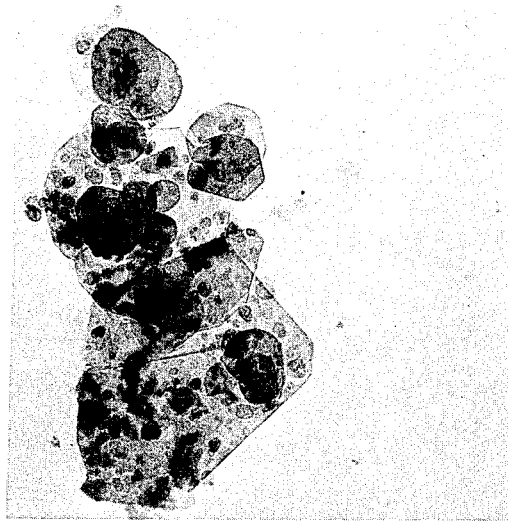
FIG. 4 is a scanning electron microscope photograph of lamellar boron nitride as used in the present invention.
Figure 5:
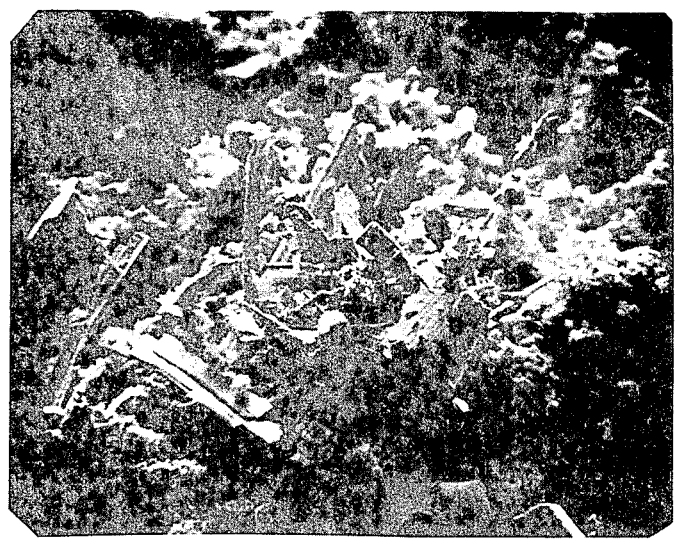
FIG. 5 is a scanning electron microscope photograph of lamellar aluminum nitride as used in the present invention.

Lamellar, of course, defines a crystalline material which consists of flat plate-like individuals superimposed upon and adhering to each other. It is most preferred in accordance with the present invention that the lamellar boron or aluminum nitride used have a thickness of about 1 to about 25% of the width thereof and a width of about 10 to less than 100% of the length thereof. If the aluminum nitride or boron nitride used in the present invention approaches a stubbier shape, such as cubic, the thermal conductivity of the formulation of the present invention is reduced. Typical examples of boron nitride and of aluminum nitrude used in the present invention are shown in FIG. 4 and FIG. 5, respectively.

Increasing the volume concentration of the filler also assists to increase the thermal conductivity of the thermal grease of the present invention; thus, lighter fillers which have a specific gravity on the order of 2-4, which include AlN and BN, produce better results than the heavier filler, zinc oxide; this effect is secondary, however, as compared to the filler particle shape.

With respect to the size of the thermal filler powder, we have generally found that decreasing the size thereof increases thermal conductivity effects without any harm to the other characteristics of the thermally conductive grease. In this regard, when zinc oxide is used, we prefer to use zinc oxide of a submicron size with 99% of all particles having an average diameter of about 5 microns or less.

On the other hand, when lamellar aluminum nitride and/or boron nitride is used, we prefer that at least about 90% of the particles thereof have a length of about 0.5 to about 20 microns, the length, of course, representing the longest dimension of the lamellar particles. No substantial proportion of the lamellar aluminum nitride or boron nitride particles present should be larger than about 25 microns, again this representing the length of longest dimension of the lamellar particles.

Material Proportions

We most prefer to use from about 15% by volume to about 60% by volume thermal filler powder, from about 0.1% to about 4% by volume silica fibers balance liquid organo-silicone carrier. Basis is always by volume, herein, unless otherwise indicated.

These proportions can be varied, but we have found that if excess variation from the above ranges are encountered, certain faults ensue. For example, if much less thermal filler powder is used, conductivity may be insufficient for some purposes, while if substantially greater thermal filler powder is used, occasionally there will be insufficient organo-silicone carrier to ensure desired thixotropic properties.

Conditions of Product Formation

The components of the present invention are conveniently well mixed at ambient conditions. The components can be heated (or cooled) during mixing to facilitate mixing, if desired, however.

It is most preferred to merely add the silica fibers to the liquid organo-silicone and then add the thermal filler powder to produce formulations with the lowest bleed. This is, however, not necessary, and the three mandatory components of the thermally conductive grease of the present invention can be mixed in any order desired. As earlier indicated, however, if the thermal filler powder is initially added to the liquid organo-silicone carrier, or vice versa, the silica fibers should be added thereto before any bleeding can occur.

The mixing may be conducted using any conventional mixing means which does not, of course, destroy the character of the silica fibers or the thermal filler powder. A typical mixing means which can be utilized is a 3 roll mill.

Since the thermally conductive grease of the present invention is thixotropic, it can be applied to the desired location using conventional means to apply thixotropic materials. For example, application can be by hand using a small spatula, can be by the use of a small injection nozzle, roller, brush coating means, or the like. No criticality is attached to the means of applying the thermally conductive grease of the present invention.

As earlier indicated, the thermally conductive grease finds particular use for heat transfer application with electronic components, particularly in systems as shown in FIG. 1 wherein reference 17 denotes the module, reference 10 denotes a conventional IC chip, reference 11 denotes metal contacts putting chip 11 into contact with substrate 12, provided with conductor pins 13. Cap 14 is placed over substrate 12 and chip 10, the thermally conductive grease 15 of the present invention being interposed between chip 10 and cap 14 in intimate contact therewith.

It is to be understood, of course that rather than merely being interposed between chip 10 and cap 14, the thermally conductive grease of the present invention could be utilized to completely fill space 16 in module 1, or can, for example, be separated from either or both of cap 14 and chip 10 by a thin film of, for example, a good heat transfer material such as a thin polymeric film which is also advisably dielectric. The thermally conductive grease of the present invention is most preferably used in direact contact with chip 10 and cap 14, however. While not shown in FIG. 1, when needed heat sinks would be provided in a conventional manner.

While the thermally conductive grease of the present invention has been described as finding particular application in cooling electronic components, it should be understood that its use is not so limited. In fact, the thermally conductive grease of the present invention finds general application wherever good heat transfer is required. However, considering the relatively high cost of the components used to formulate the thermally conductive grease of the present invention, typically it will be utilized in precision applications, that is, wherein the specific characteristics of the thermally conductive grease of the present invention are required.

Having thus generally described the invention, the following examples of currently preferred modes of practicing the invention are offered to illustrate the same.

EXAMPLE 1

In this, and all examples, reagent grade materials were used. This is an important aspect of the present invention since the use of highly pure materials (reagent grade) avoids corrosion problems often encountered with prior art thermally conductive greases and insures low water absorption in use.

In this example, approximately 55 ml of polydimethylsiloxane was placed into an appropriate container. The polydimethylsiloxane was reagent grade and had a specific gravity of 0.97 at 25° C., a dielectric constant of 2.5 KHz, a dielectric strength of 350 volts/ml, and a viscosity of 100 Cs at 25° C.

Two volume percent silica fibers having a size of less than 5 microns, majority less than 1 micron, were then added thereto at room temperature and well mixed therein.

After thorough mixing, we then added 39.5% by volume (all percentages are based upon the final thermally conductive grease volume) of lamellar aluminum nitride having a particle size of 1 to 20 microns, again mixing well to insure formation of a uniform mixture of all components. In more detail, substantially all of the aluminum nitride was lamellar and had a particle size in the 1 to 20 micron range for length, with no particles having a length larger than 25 microns. While precise measurements of thickness and width were not taken, this being unnecessary, both thickness and width were within our preferred bounds, i.e., thickness was 1 to 25% of width and width was 10 to less than 100% of length. The lamellar aluminum nitride was essentially the same as shown in FIG. 4. The thermal conductivity of the resulting product is shown in the attached FIG. 2 by data point 1.

EXAMPLE 2

The procedure of Example 1 was followed except that the amount of lamellar aluminum nitride was reduced to 25% by volume; all other parameters were the same.

The thermal conductivity of the resulting thermally conductive grease is represented in the attached FIG. 3 by data point 2.

EXAMPLE 3

The procedure of Example 1 was followed except that the lamellar aluminum nitride was replaced by lamellar boron nitride of similar dimensions and the boron nitride was used in an amount of only about 35% by volume. Again, substantially all of the boron nitride was lamellar.

The resulting thermally conductive grease illustrated a thermal conductivity as shown by data point 3 in attached FIG. 2.

EXAMPLE 4

Following the procedure of the above examples, except for substituting varying proportions of dendritic zinc oxide having a particle size of less than 5 microns, the results shown in FIG. 2 by the zinc oxide curve were obtained upon measuring the thermal conductivity of the resulting thermally conductive grease. In each case, the thermally conductive grease comprised the indicated percent volume of zinc oxide, 0.2 to 2% by volume silica fibers as used in Example 1, balance polydimethylsiloxane as used in Example 1. All of the zinc oxide was in the dentritic form.

COMPARATIVE EXAMPLES 1 AND 2

Following the procedure of Example 4 except for substituting spherical particles of $SiO_2$, the results obtained as indicated by the $SiO_2$ curve in attached FIG. 2 were obtained.

Duplicating the above comparative example, cubic particles of $Al_2O_3$ were used in place of the cubic or spherical particles of $SiO_2$. Results sunbstantially identical to those obtained utilizing $SiO_2$ were obtained, confirming that the use of cubic or spherical particles as a thermal filler powder did not provide the excellent results achieved in accordance with the present invention.

The following Examples 5-8 were conducted to measure some of the more specific physical characteristics of the thermally conductive grease compositions of the present invention.

EXAMPLE 5

Using polydimethylsiloxane, dendritic zinc oxide particles and silica fibers as in Example 4, a thermally conductive grease composition in accordance with the present invention was formulated following the procedure of Example 4 except for using a ratio by weight of zinc oxide to polydimethylsiloxane of 4.6:1 and 2% by weight silica fibers.

Bleed was determined by permitting the thus formulated thermally conductive grease to sit in a filter paper suspended in an open flask for 24 hours at 200° C. The percent by weight of the polydimethylsiloxane which escaped from the thermally conductive grease through the filter paper at the end of this test period is expressed as "bleed" in weight percent based upon the total weight of the thermally conductive grease.

EXAMPLES 6 AND 7

Examples 6 and 7 were then conducted. For Example 6, the basic procedure and materials as described in Example 3 above were utilized except for using a lamellar aluminum nitride:polydimethylsiloxane ratio by weight (solids:liquid) of 1:1, and in Example 7 the basic procedure and materials as described in Example 3 above were utilized except for using a lamellar boron nitride:polydimethylsiloxane ratio by weight (solids:liquid) of 1.18:1.

The K value for each thermal filler powder, the bleed value following testing for 24 hours at 200° C., the amount of filler and characteristics of the resulting thermally conductive grease are set forth in the following table.

|  | EXAMPLE 5 | EXAMPLE 6 | EXAMPLE 7 |
|---|---|---|---|
|  | (ZnO) | (AlN) | (BN) |
| K* | 2.478 | 2.14 | 2.1 |
| Bleed | 0.07% | <1% | <1% |
| Filler[1] | 0.3% | .7% | 2.63% |
| Dielectric[2] Strength | 360 | 300 | 300 |
| Volume[3] Resistivity | $4 \times 10^{13}$ | $3 \times 10^{14}$ | $2.85 \times 10^{14}$ |
| Dielectric[4] Constant | 4.13 | 4.0 | 4.48 |
| Dissipation[5] | 1.33 | 1.3 | 1.13 |
| Specific Gravity | 4.7 | 3.0 | 1.66 |

*K values are for the thermal filler powder; units × 10 [3] $Cals/Cm^2/C.°/S/Cm$. All other parameters are for the thermally conductive grease.
[1] Wt. % of grease.
[2] In volts/Mil.
[3] In ohm/Cm.
[4] In KHz.
[5] Unitless.

EXAMPLE 8

Following the procedure of Example 4 for formulating a dendritic zinc oxide containing thermally conductive grease and the procedure of Example 3 for formulating a lamellar boron nitride containing thermally conductive grease, we formulated three thermally conductive greases exactly as set forth in the corresponding Examples 4 and 3, respectively, except for varying the amount of zinc oxide in run 1 to 75% by weight, the amount of zinc oxide in run 2 to 82% by weight, and the amount of boron nitride in run 3 to 54% by weight.

After these thermally conductive grease compositions were formed, they were applied to individual single chip 25 mm MC modules as shown in FIG. 1 to encapsulate the same. The chip/cap gap was 2-10 mils. Specifically, the thermally conductive greases were silk-screened onto the chips before caps were put on in an amount of 0.5"×0.5"×0.03" in volume per chip.

Thereafter, the resistance through the grease was measured with the module being thermally isolated so that all of the heat generated was forced through the thermally conductive grease layer into measuring means. With 1 watt of power dissipation at the chip, the difference between the chip temperature and the temperature of the measuring apparatus was determined to yield the thermal resistance value of the thermally conducting grease layer in °C./watt units. An average value of four readings were used to obtain the values set forth below.

In run 1, thermal resistance through the grease in °C./watt at 1 watt was 4.9 and at 2 watts was 4.5; in run 2, these values were 4.7 and 4.6, respectively; and in run 3, these values were 6.7 and 6.35, respectively.

While the invention has been described in detail and with reference to specific embodiments thereof, it will be apparent to one skilled in the art that various changes and modifications can be made therein without departing from the spirit and scope thereof.

What is claimed is:

1. A non-bleeding thixotropic thermally conductive material comprising a liquid organo-silicone carrier, substantially spherical silica in an amount effective to prevent bleeding of said liquid carrier, substantially all of said silica being less than 5 microns in size, and one or more thermal filler powders selected from the group consisting of dendritic zinc oxide, lamellar aluminum nitride, lamellar boron nitride and a mixture of two or more thereof, said silica being added to said liquid organo-silicone carrier prior to the adding of said one or more thermal filler powders, whereby said material is rendered non-bleeding.

2. The material of claim 1 wherein said thermal filler powder is said lamellar aluminum nitride.

3. The material of claim 1 wherein said thermal filler powder is said lamellar boron nitride.

4. The material of claim 1 wherein said thermal filler powder is said dendritic zinc oxide.

5. The material of claim 1 which comprises from about 15% by volume to about 60% by volume of said thermal filler powder, from about 0.1 to about 4% by volume of said silica, balance by volume of said organo-silicone liquid carrier.

6. The material of claim 5 which further comprises less than 5% by volume of a wetting agent to facilitate mixing of the material and to permit increased amounts of thermal filler powder to be present.

7. The material of claim 5, wherein of said zinc oxide at least 99% has an average diameter of 5 microns or less.

8. The material of claim 7, wherein at least about 80 volume percent of said silica has a size of less than 1 micron.

9. The material of claim 5, wherein said material consists essentially of said liquid organo-silicone carrier, said silica and said one or more thermal filler powders.

10. The material of claim 5, wherein said lamellar aluminum nitride and said lamellar boron nitride have a length of about 0.05 to about 20 microns, a width of about 10 to less than 100% of the length thereof and a thickness of about 1 to about 25% of the width thereof.

* * * * *